United States Patent
Kasuya et al.

(10) Patent No.: US 6,888,726 B2
(45) Date of Patent: May 3, 2005

(54) PC CARD CASE AND PC CARD

(75) Inventors: Takayuki Kasuya, Tokyo (JP); Kazuhiro Homma, Tokyo (JP); Hidenori Aizawa, Tokyo (JP); Koichi Endo, Tokyo (JP)

(73) Assignees: TDK Corporation, Tokyo (JP); Honda Tsushin Kyogo Co., Ltd., Tokyo (JP)

( * ) Notice: Subject to any disclaimer, the term of this patent is extended or adjusted under 35 U.S.C. 154(b) by 142 days.

(21) Appl. No.: 10/242,751

(22) Filed: Sep. 13, 2002

(65) Prior Publication Data

US 2003/0053299 A1 Mar. 20, 2003

(30) Foreign Application Priority Data

Sep. 17, 2001 (JP) ........................................ 2001-281462

(51) Int. Cl.⁷ .............................. H05K 5/02; H05K 7/12; H05K 5/04
(52) U.S. Cl. ........................ 361/737; 361/740; 361/747; 361/759; 361/801

(58) Field of Search ................................. 361/737, 740, 361/726, 747, 732, 759, 752, 741, 801, 802, 736; 70/85

(56) References Cited

U.S. PATENT DOCUMENTS 5,513,074 A * 4/1996 Ainsbury et al. ............ 361/737
5,846,092 A * 12/1998 Feldman et al. ............ 439/76.1
6,496,381 B1 * 12/2002 Groeger ...................... 361/761
6,527,188 B1 * 3/2003 Shobara et al. ............. 235/486

FOREIGN PATENT DOCUMENTS

JP          11-099779          4/1999

* cited by examiner

Primary Examiner—David Martin
Assistant Examiner—Dameon E. Levi
(74) Attorney, Agent, or Firm—Wenderoth, Lind & Ponack L.L.P.

(57) ABSTRACT

An improved PC card case includes a casing body and a cover plate to cover the extended part of the casing body. The cover plate and the extended part are fastened together by non-unlatching, counter-hook latch means.

19 Claims, 6 Drawing Sheets

PC CARD CASE AND PC CARD

BACKGROUND OF THE INVENTION

1. Field of the Invention

The present invention relates to a PC card to be used in an electronic device, such as personal computer. The invention particularly relates to a PC card having an extended section on its rear side, and to a PC card case containing such an extended PC card.

2. Related Arts

Referring to FIG. 7, a conventional PC card 10 has a function-expanding printed circuit board contained in its rectangular, synthetic resin case 11. As shown, it has a contact section 12 formed on its front side for mating with the counter contact of an electronics device such as a notebook-sized personal computer, and it has an extended section 13 formed on its rear side. The extended section has an antenna, a liquid crystal display and similar components installed therein. The opposite sides of the PC card 10 are covered by metal shells 14a and 14b of stainless steel, whereas the extended section 13 is covered by a cover plate 15 of a synthetic resin material.

For example, the cover plate 15 can be fixed to the extended section 13 as follows: through holes are made in the cover plate 15 and recesses in the extended section 13. Screws are inserted in the through holes to be driven into the recesses, thus making the screws self-tap in the recesses. Another possibility is ultrasonic wave welding of the cover plate to the extended section.

The cover plate when fixed to the extended section with screws can be easily removed from the extended section by unscrewing. Unfortunately, the screws are apt to be loosened. When the cover plate is welded to the extended section, these parts are integrally connected, not permitted from separating easily. This kind of fastening requires extra welding step, however, which causes additional expense.

One object of the present invention is to provide a PC card which is free of such defects as described above.

Another object of the present invention is to provide a PC card case which permits its cover plate to fasten to the extended section in non-unlatching way.

SUMMARY OF THE INVENTION

To attain these objects a PC card case comprising a casing body and a cover plate to cover a part of the casing body is improved according to the present invention in that the cover plate and the part are fastened together with a non-unlatching, counter-hook latch mechanism. The part of the casing body to be discovered is the extended section of the casing body. The cover plate is fastened to the extended section of the casing body with non-unlatching, non-releasing counter-hook latch mechanism, thereby preventing removal of the cover plate from the extended section of the casing body to assure that the extended is protected.

The non-unlatching, counter-hook latch means comprises two counter hooks fixed to the part of the casing body and the cover plate so that they can meet with each other when they are moved toward each other in the longitudinal or lateral direction.

The cover plate can be fastened to the part of the casing body with a non-unlatching, counter-hook latch mechanism when the cover plate slides on the part of the casing body in the longitudinal or lateral direction. Once they fastened with the latch, they cannot be separated from each other even though the PC card is shocked or shaken. The extended section has a slot made on one side, thereby allowing the corresponding side of the cover plate to fit in the slot of the extended section. This arrangement gives a better protection to the extended section of the casing body, and facilitates orientation of the cover plate relative to the extended section in assembling.

A PC card to be mounted and used in an information-processing device is contained in a PC card case described above.

A PC card comprising at least a card body including metal shells and an extended section having a cover plate applied thereto, is improved according to the present invention in that each metal shell has one or more projections formed on one side. Thus, each metal shell is combined with the cover pate with the projection or projections crawled (slid) under the corresponding side of the cover plate. The cover plate has one or more projections formed on one side, so that the cover plate is combined with the metal shell with the projection or projections crawled under the corresponding side of the metal shell. This arrangement effectively prevents the cover plate from rising from the metal shell, leaving no gap therebetween. Thus, invasion of dust particles in the PC card is prevented, so that the reliability of the PC card is increased.

The present invention can be well applied to PC cards according to the PCMCIA standard, and can be equally applied to various cards. For instance, as a first example, the invention can be applied to a small-sized flash memory card, "Compact Flash" (Registered Trademark) proposed by the Compact Flash Association (outside dimensions 36.4×42.8× 3.3 mm; and 8 to 192 MB). As a second example, the invention can be applied to a small-sized PC card, "Small PC Card" proposed by Matushita Denchi Kogyo K. K., JEIDA (the Japan Electronic Industry Development Association) and by PCMCIA (outside dimensions 45.0× 42.8×5.0 mm; one half of the longitudinal size of a conventional PC card). Thirdly, the invention can be applied to a small-sized card, "Miniature Card" proposed by the Miniature Card Implementers Forum and by the PCMCIA (outside dimensions 38×33×3.5 mm). Fourthly, the invention can be applied to a small-sized card, "Smart Media" (Registered Trademark) proposed by SSFDC Forum and commercially available from Toshiba (outside dimensions 37×45×0.67 mm; for example, a flash EEPROM card of 2 to 64 MB). As a fifth example, the invention can be applied to a small-sized card, "Multi Media Card" proposed by the Multi Media Card Association (outside dimensions 24×32×1.4 mm; for example, a flash EEPROM card of 64 MB). As a final example, the invention can be applied to a small-sized card, "Memory Stick" (Registered Trademark) proposed by Sony (outside dimensions 21.5×50×2.8 mm; for example, a flash EEPROM card of 64 MB).

Another example is a small-sized PC card equipped with a hard disk drive for magnetic record. The small-sized cards as described above and other similar cards are called a "PC card" in the specification and claims.

Other objects and advantages of the present invention will be understood from the following description of a PC card and a PC card case according to the present invention, which are shown in accompanying drawings.

DETAILED DESCRIPTION OF PREFERRED EMBODIMENT

Figure 1A:
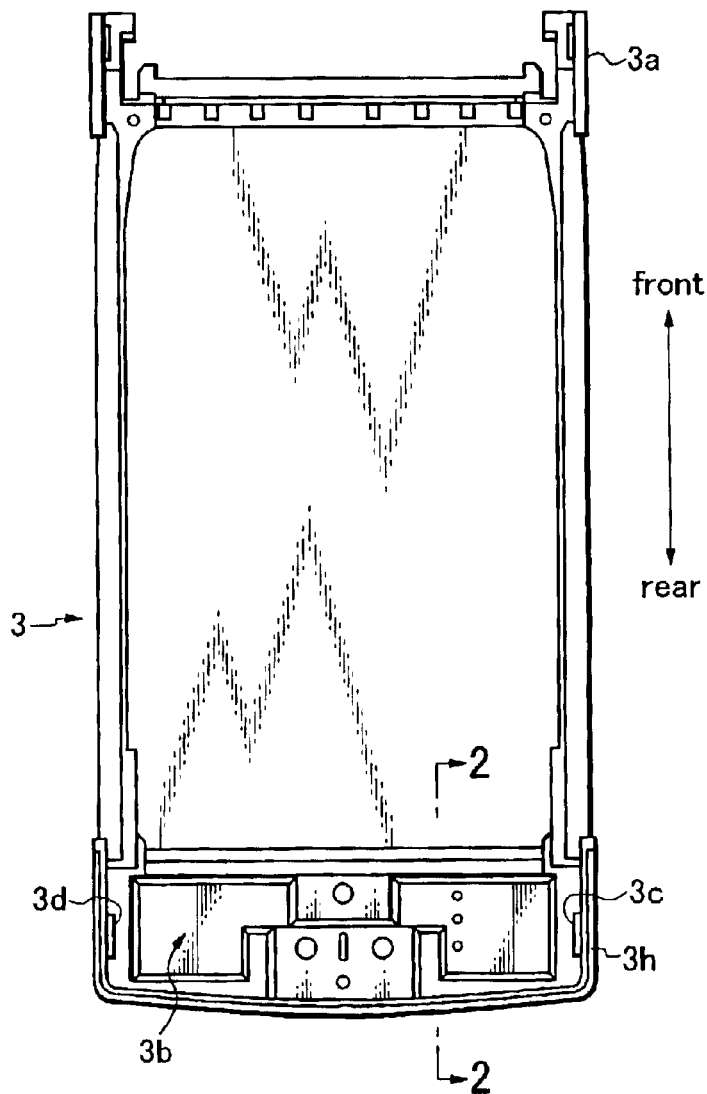
FIGS. 1(A), (B) and (C) are plan, side and bottom views, respectively, of the casing body of a PC card case according to the present invention.
Figure 1B:
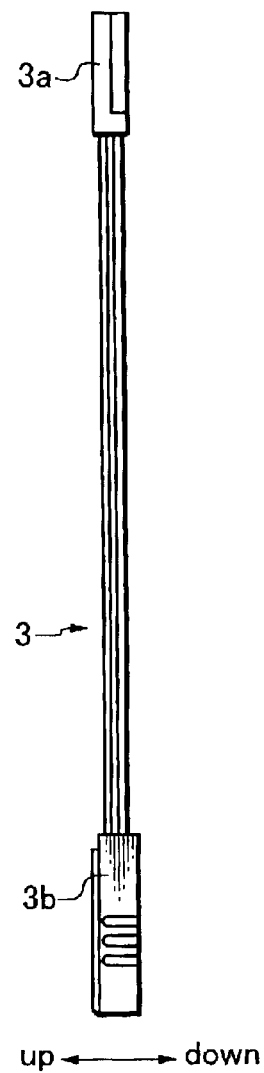
Figure 1C:

Referring to FIG. 1, a PC card case 2 according to the present invention comprises a casing body 3 and a cover plate 4. The casing body 3 has a rectangular frame formed of a synthetic resin material. A large space is made in the major part of the rectangular frame of casing body 3 for accommodating a printed circuit board therein. A "U"-shaped section 3a is formed at the front end of the frame 3 for accommodating a counter connector, and an extended section 3b is formed at the rear end of the frame 3. The extended section 3b is covered by the cover plate 4. The main part of the casing body 3 (the part other than the extended section 3b) is the same in size and shape as an ordinary PC card according to the prescriptions of PCMCIA/JEIDA, particularly about 85.6 mm long, about 54.0 mm wide and about 5.0 mm thick, including the thickness of opposite metal shells. A substantial part including the opposite metal shells is the same in shape as a PC card, and is called "card body". The extended section 3b is 5.0 mm thick, and will appear out of a personal computer housing when inserted in the card slot of the computer housing.

Figure 2:
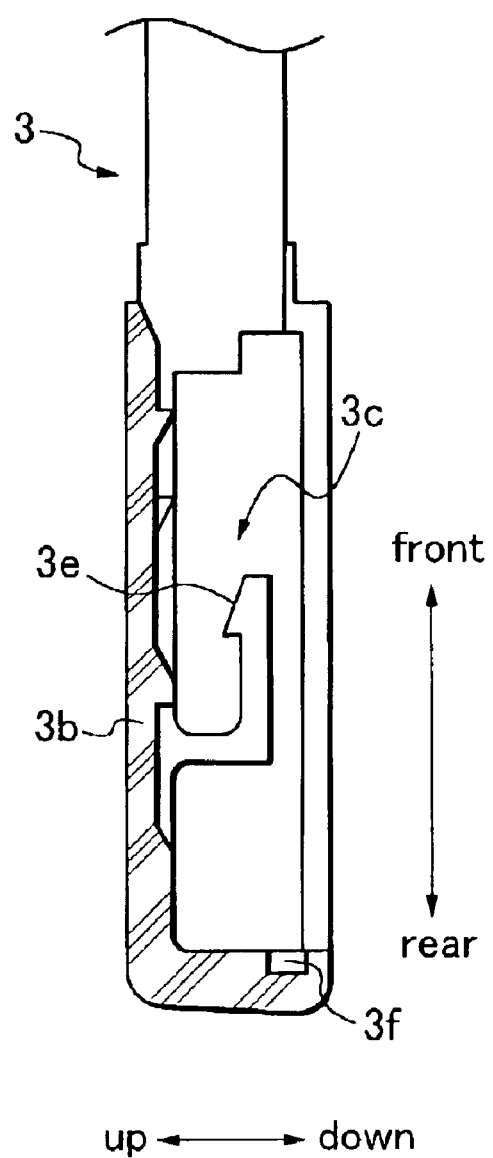
FIG. 2 is a sectional view of the casing body taken along the line 2—2 in FIG. 1(A)

Referring to FIGS. 1 and 2, the extended section (casing body) 3b has hooks 3c and 3d formed on its opposite sidewalls. These hooks 3c and 3d are aligned in the lateral direction. As best shown in FIG. 2, each hook is an inverted "L"-shaped piece having an engagement nail 3e formed at its end, having a first leg extending from an outer shell of the extended section, and having a second leg extending from a distal end of the first leg so as to be orthogonal to the first leg.

Figure 3A:
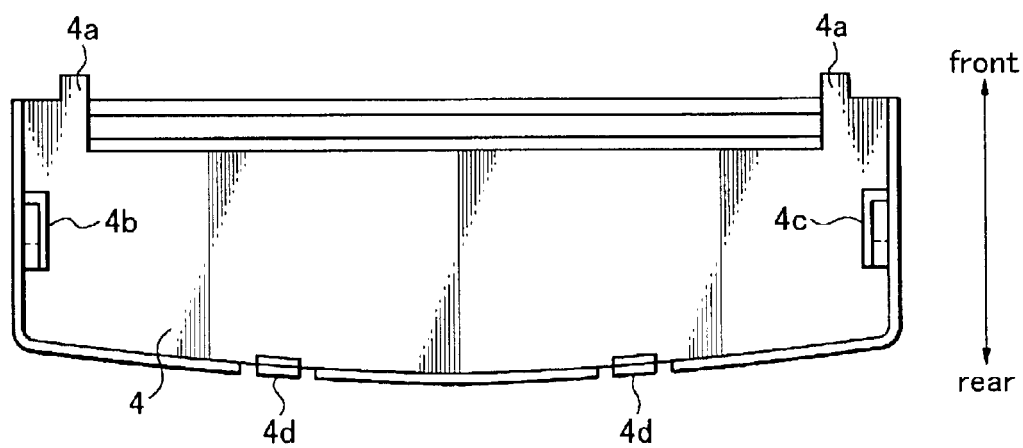
FIG. 3(A) shows inside of a cover plate to be applied to the extended section of the casing body and FIG. 3(B) is a side view thereof.
Figure 3B:
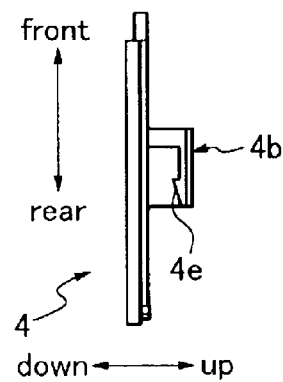
Figure 4A:
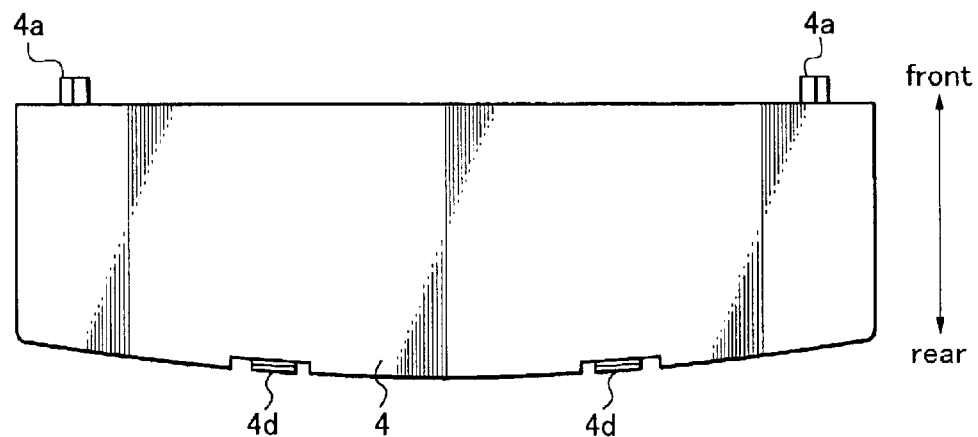
FIG. 4(A) shows outside surface of the cover plate, and FIGS. 4(B) and (C) are side and bottom end views thereof.
Figure 4B:
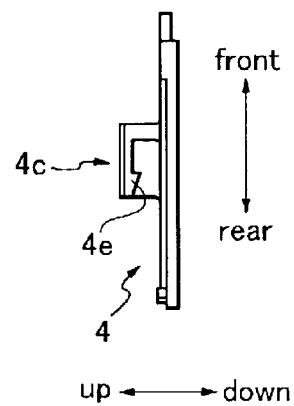
Figure 4C:
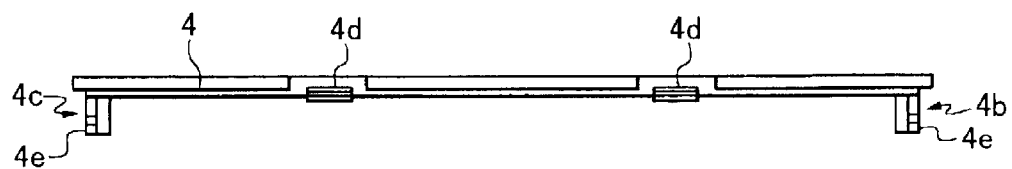

Referring to FIGS. 3 and 4, the cover plate 4 is a flat plate large enough to cover the rear side opening of the extended section 3b. Two projections 4a are formed on the front edge of cover plate 4 to catch the adjoining edge of the metal shell 5 when the cover plate 4 is applied to the extended section 3b; two counter hooks 4b and 4c are formed on the opposite sides of the cover plate 4, and two projections 4d are formed on the rear edge of the cover plate 4 to snap in recesses 3f made in the casing body 3 (see FIG. 2).

The extended section 3b has an encircling slot 3h on its opposite and rear sides, thereby permitting the cover plate 4 to fit on the extended section 3b in exactly the right position.

The counter hooks 4b and 4c are inverted "L"-shaped pieces each having an engagement nail 4e formed at its end (see FIG. 4B). The vertical (first) leg of the inverted "L"-shaped piece extends downward (i.e., outward from the outer shell of the cover plate), and the horizontal (second) leg of the inverted "L"-shaped piece extends parallel to the cover plate 4 and is orthogonal to the first leg. These counter hooks 4b and 4c are so placed on the cover plate 4 so that they can mate with (engage) the hooks 3c and 3d of the extended section (casing body) 3b, thus fastening the cover plate 4 to the extended section 3b in non-unlatching way.

Figure 5:
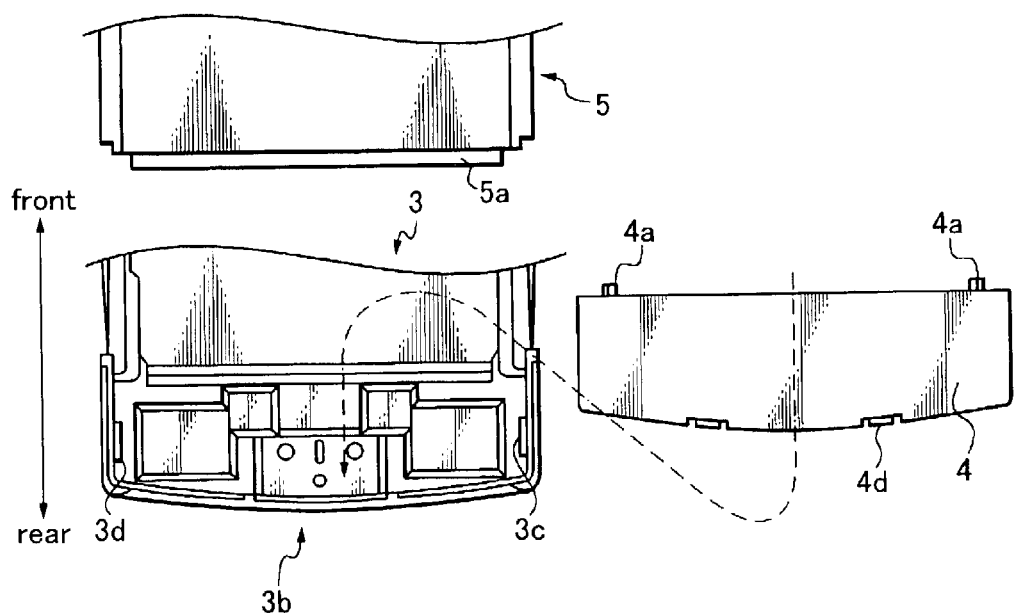
FIG. 5 shows how the cover plate can be applied to the extended section of the casing body.

In assembling, a printed circuit board is put in the rectangular space of the frame-like casing body 3, and then, the cover plate 4 is put on the extended section 3b as shown in FIG. 5. While the cover plate 4 is pushed rearward in the longitudinal direction, the projections 4d snap into recesses 3f of the casing body 3, allowing the hooks 3c and 3d to mate with the counter hooks 4b and 4c in non-unlatching way.

In this particular embodiment, the hooks 3c and 3d and the counter hooks 4b and 4c are so arranged that the hooks 3c and 3d may meet with (engage) the counter hooks 4b and 4c when the cover plate 4 is made to slide on the extended section in the longitudinal direction. The hooks 3c and 3d and the counter hooks 4b and 4c, however, may also be arranged so that they may meet with (engage) each other when the cover plate 4 slides on the extended section 3b in the lateral direction. In other words, the hooks 3c and 3d of the extended section 3b, and the hooks 4b and 4c of cover plate 4 are designed and arranged to engage each other (and, thus, allow cover plate to engage extended section 3b) by moving cover plate 4 in a direction parallel (longitudinally or laterally) to a plane of the extended section b.

The metal shell 5 has a lateral projection 5a formed on its rear edge, whereas the cover plate 4 has two front projections 4a formed on its front edge. Thus, the metal shell 5 and the cover plate 4 can be nested together by making the lateral projection 5a of the metal shell 5 crawl (slide) under the front edge of the cover plate 4, and by making the opposite projections 4a crawl (slide) under the rear edge of the metal shell 5, thereby keeping the metal shell 5 and the cover plate 4 coplanar with each other. Thus, there remains no gap between the metal shell 5 and the cover plate 4, so that dust particles are prevented from invading the inside of the PC card. In this particular embodiment, the metal shell 5 has a lateral projection 5a formed on its rear edge, whereas the cover plate 4 has two front projections 4a formed on its front edge. Conversely, the metal shell 5 may have two projections formed on its rear edge, whereas the cover plate 4 may have a lateral projection formed on its front edge. The lateral projection may be replaced by two projections on the adjoining edges, provided that the confronting projections thus formed on the adjoining edges be staggered to prevent any interference, or the two projections may be replaced by the lateral projection formed on the adjoining edges, provided that the confronting lateral projections thus formed on the adjoining edges be staggered to prevent any interference.

Figure 6:
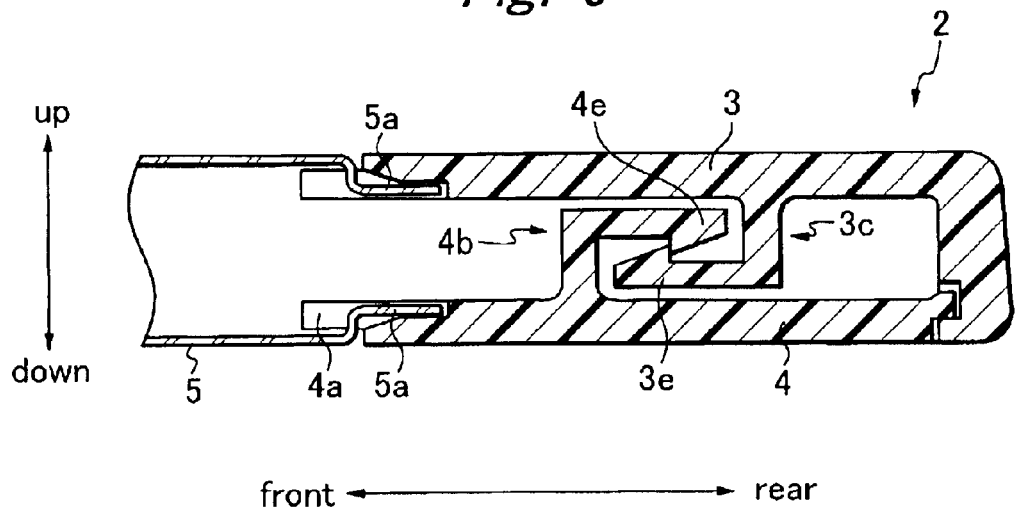
FIG. 6 shows how the cover plate can be fastened to the casing body with a non-unlatching, counter-hook latch means.
Figure 7A:
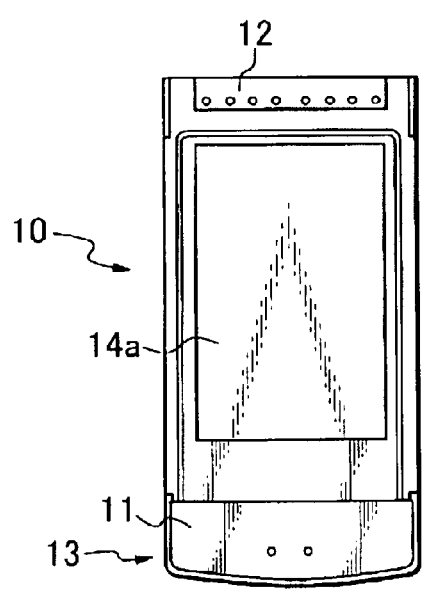
FIGS. 7(A), (B), (C) and (D) are front, side, rear and bottom views, respectively of a conventional PC card.
Figure 7B:
Figure 7C:
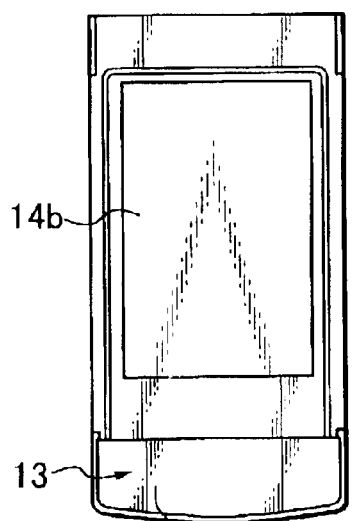
Figure 7D:
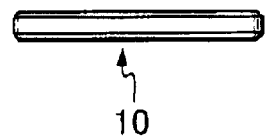

When the cover plate 4 is made to slide on the extended section in the longitudinal direction, the hook 3c or 3d meets with (opposes) the counter hook 4b or 4c on either side of the PC casing so that their nails 3e and 4e engaged with each other, thus fastening the cover plate 4 to the extended section 3b in non-unlatching fashion, as seen from FIG. 6. Then, the cover plate 4 cannot be removed from the extended section 3b, no matter in which direction the cover plate 4 may be pulled or pushed away from the extended section 3b.

As an alternative configuration, the hooks and counter hooks may be so oriented so that they may meet with each other when moving toward each other in the vertical direction, and so that the cover plate and the expanded section cannot move apart from each other in the horizontal direction. The PC card thus latched has an increased resistance to the vertical shock or shake.

As may be understood from the above, the cover plate and the extended section of the PC casing are fastened together in non-unlatching way, so that the PC card may not be disassembled easily. At the same time, the resistance of the PC card to the shock or shake can be significantly increased. The metal shell and the cover plate are prevented from rising above each other, so that they may be kept coplanar with each other. Fastening of the adjoining parts with the non-unlatching (non-releasing) counter-hook latch mechanism is much easier than fastening of the adjoining parts with screws or by welding. Accordingly the manufacturing cost can be reduced. The PC card is well protected by the cover plate, which is fastened to the casing with the non-unlatching counter-hook latch mechanism, and it has an increasing reliability.

What is claimed is:

1. A PC card case comprising:
    a casing body;
    a cover plate for covering a portion of said casing body; and
    a counter-hook latch mechanism for unreleasably fastening said cover plate to said casing body, said counter-hook latch mechanism being shaped and arranged so as to be entirely enclosed within said casing body and said cover plate when said cover plate is fastened to said casing body to thereby be inaccessible from an exterior of said PC card case, said counter-hook latch mechanism comprising a first hook fixed to said casing body and a second hook fixed to said cover plate, said first hook and said second hook being shaped and arranged so as to become engaged when moved toward each other in a direction parallel to a plane of said casing body.

2. The PC card case of claim 1, wherein said portion of said casing body covered by said cover plate comprises an extended section of said casing body.

3. The PC card case of claim 2, wherein said extended section has a slot formed on one side thereof for allowing a side of said cover plate corresponding to said one side of said extended section to be fitted in said slot.

4. The PC card case of claim 1, wherein said first hook and said second hook are shaped and arranged so as to become engaged when moved toward each other in one of a direction parallel to a longitudinal axis of said casing body and a direction perpendicular to a longitudinal axis of said casing body.

5. The PC card case of claim 1, wherein said portion of said casing body covered by said cover plate comprises an extended section of said casing body, said extended section having a slot formed on one side thereof for allowing a side of said cover plate corresponding to said one side of said extended section to be fitted in said slot.

6. A PC card to be mounted and used in an information processing device, comprising:
    a card body including a metal shell; and
    a PC card case including:
        a casing body;
        a cover plate for covering a portion of said casing body; and
        a counter-hook latch mechanism for unreleasably fastening said cover plate to said casing body, said counter-hook latch mechanism being shaped and arranged so as to be entirely enclosed within said casing body and said cover plate when said cover plate is fastened to said casing body to thereby be inaccessible from an exterior of said PC card case, said counter-hook latch mechanism comprising a first hook fixed to said casing body and a second hook fixed to said cover plates said first hook and said second hook being shaped and arranged so as to become engaged when moved toward each other in a direction parallel to a plane of said casing body.

7. The PC card of claim 6, wherein said portion of said casing body covered by said cover plate comprises an extended section of said casing body.

8. The PC card of claim 7, wherein said extended section has a slot formed on one side thereof for allowing a side of said cover plate corresponding to said one side of said extended section to be fitted in said slot.

9. The PC card of claim 6, wherein said first hook and said second hook are shaped and arranged so as to become engaged when moved toward each other in one of a direction parallel to a longitudinal axis of said casing body and a direction perpendicular to a longitudinal axis of said casing body.

10. The PC card of claim 6, wherein said portion of said casing body covered by said cover plate comprises an extended section of said casing body, said extended section having a slot formed on one side thereof for allowing a side of said cover plate corresponding to said one side of said extended section to be fitted in said slot.

11. The PC card case of claim 1, wherein:
    said casing body includes a metal shell having at least one projection formed on a side thereof, and having an extended section; and
    said cover plate covers said extended section of said casing body, said cover plate having at least one projection formed on a side thereof, said metal shell and said cover plate being shaped and arranged such that when said cover plate covers said extended section, said at least one projection of said cover plate is positioned under said side of said metal shell and said at least one projection of said metal shell is positioned under said side of said cover plate.

12. A PC card case comprising:
    a casing body having a first hook; and
    a cover plate having a second hook for latching said first hook of said casing body so as to fasten said cover plate to said casing body, said first hook and said second hook being shaped and arranged so as to be entirely enclosed within said casing body and said cover plate when said cover plate is fastened to said casing body to thereby be inaccessible from an exterior of said PC card case, and shaped and arranged so as to become engaged when moved toward each other in a direction parallel to a plane of said casing body.

13. A PC card, comprising:
    a card body including a metal shell; and
    a PC card case including:
        a casing body having a first hook; and
        a cover plate having a second hook for latching said first hook of said casing body so as to fasten said cover plate to said casing body, said first hook and said second hook being shaped and arranged so as to be entirely enclosed within said casing body and said cover plate when said cover plate is fastened to said casing body to thereby be inaccessible from an exterior of said PC card case.

14. The PC card case of claim 1, wherein:
    said first hook has a first leg extending from said casing body, a second leg extending from a distal end of said first leg of said first hook along a longitudinal axis of said PC card case and orthogonal to said first leg of said first hook, and has an engagement nail at a distal end of said second leg of said first hook; and said second hook has a first leg extending from said cover plate, a second leg extending from a distal end of said first leg of said second hook along the longitudinal axis of said PC card case and orthogonal to said first leg of said second hook, and has an engagement nail at a distal end of said second leg of said second hook, said engagement nail of said second hook being shaped and arranged to engage said engagement nail of said first hook when said cover plate is fastened to said casing body.

15. The PC card case of claim 14, wherein said first hook and said second hook are shaped and arranged so as to approach and engage each other when said cover plate slides on said casing body along the longitudinal axis of said PC card case so as to thereby fasten said cover plate to said casing body.

16. The PC card of claim 6, wherein:

said first hook has a first leg extending from said casing body, a second leg extending from a distal end of said first leg of said first hook along a longitudinal axis of said PC card case and orthogonal to said first leg of said first hook, and has an engagement nail at a distal end of said second leg of said first hook; and said second book has a first leg extending from said cover plate, a second leg extending from a distal end of said first leg of said second hook along the longitudinal axis of said PC card case and orthogonal to said first leg of said second hook, and has an engagement nail at a distal end of said second leg of said second hook, said engagement nail of said second hook being shaped and arranged to engage said engagement nail of said first hook when said cover plate is fastened to said casing body.

17. The PC card case of claim 16, wherein said first hook and said second hook are shaped and arranged so as to approach and engage each other when said cover plate slides on said casing body along the longitudinal axis of said PC card case so as to thereby fasten said cover plate to said casing body.

18. The PC card of claim 12, wherein:

said first hook has a first leg extending from an outer shell of said casing body, a second leg extending from a distal end of said first leg of said first hook along a longitudinal axis of said PC card case and orthogonal to said first leg of said first hook, and has an engagement nail at a distal end of said second leg of said first hook; and said second hook has a first leg extending from an outer shell of said cover plate, a second leg extending from a distal end of said first leg of said second hook along the longitudinal axis of said PC card case and orthogonal to said first leg of said second hook, and has an engagement nail at a distal end of said second leg of said second hook, said engagement nail of said second hook being shaped and arranged to approach and engage said engagement nail of said first hook when said cover plate slides on said casing body along the longitudinal axis of said PC card case so as to thereby fasten said cover plate to said casing body.

19. The PC card of claim 13, wherein:

said first hook has a first leg extending from an outer shell of said casing body, a second leg extending from a distal end of said first leg of said first hook along a longitudinal axis of said PC card case and orthogonal to said first leg of said first hook, and has an engagement nail at a distal end of said second leg of said first hook; and said second hook has a first leg extending from an outer shell of said cover plate, a second leg extending from a distal end of said first leg of said second hook along the longitudinal axis of said PC card case and orthogonal to said first leg of said second hook, and has an engagement nail at a distal end of said second leg of said second hook, said engagement nail of said second hook being shaped and arranged to approach and engage said engagement nail of said first hook when said cover plate slides on said casing body along the longitudinal axis of said PC card case so as to thereby fasten said cover plate to said casing body.

* * * * *